United States Patent [19]

Kitagawa et al.

[11] Patent Number: 5,469,962
[45] Date of Patent: Nov. 28, 1995

[54] PACKING MATERIALS FOR ELECTROLYTIC CAPACITORS

[75] Inventors: Toshiyuki Kitagawa; Hideharu Nagai; Junkichi Kawamura; Hitoshi Mizuguchi, all of Kyoto, Japan

[73] Assignee: Matsushita Electric Industrial Co., Ltd., Kadoma, Japan

[21] Appl. No.: 265,638

[22] Filed: Jun. 24, 1994

Related U.S. Application Data

[63] Continuation of Ser. No. 969,357, Oct. 30, 1992.

[30] Foreign Application Priority Data

Nov. 8, 1991 [JP] Japan ................... 3-29771

[51] Int. Cl.$^6$ ..................... B65D 73/02; B65D 85/42
[52] U.S. Cl. .................. 206/723; 206/562; 206/564; 206/589; 206/590; 206/592; 206/725; 206/726
[58] Field of Search ................... 206/328, 332, 206/334, 329, 562, 564, 589, 590, 591, 592, 593

[56] References Cited

U.S. PATENT DOCUMENTS

| | | | |
|---|---|---|---|
| 3,191,791 | 6/1965 | Jackson | 206/332 |
| 3,469,686 | 9/1969 | Gutsche et al. | 206/564 |
| 4,671,407 | 6/1987 | Brutosky | 206/564 |
| 4,765,463 | 8/1988 | Chanel | 206/564 |
| 4,942,965 | 7/1990 | Comer | 206/593 |
| 5,133,452 | 7/1992 | Ohashi | 206/328 |

FOREIGN PATENT DOCUMENTS

2163401  2/1986  United Kingdom ............ 206/328

Primary Examiner—Jimmy G. Foster
Assistant Examiner—Marie Denise Patterson
Attorney, Agent, or Firm—Willian Brinks Hofer Gilson & Lione

[57] ABSTRACT

This invention relates to packing methods and materials for packing electrolytic capacitors and the like. This invention provides packing methods whereby capacitors are held in a container tray with a good order and with no rotational movement of capacitor and packing materials wherein packing of electrolytic capacitors solves the problem of capacitor rotation and allows the capacitors to be easily taken out of the container tray. According to this invention, an electrolytic capacitor loaded container tray is taken out of a receptacle and the electrolytic capacitors held in the container tray in an orderly manner can be smoothly picked up for automatic mounting on printed wiring boards.

25 Claims, 5 Drawing Sheets

PACKING MATERIALS FOR ELECTROLYTIC CAPACITORS

This is a continuation application of application Ser. No. 07/969,357 filed Oct. 30, 1992.

BACKGROUND OF THE INVENTION

1. Field of the Invention

The present invention relates to packing methods of capacitors such as electrolytic capacitors and the like and packing materials thereof.

2. Description of the Prior Art

A conventional way employed in packing electrolytic capacitors has been just putting electrolytic capacitors in cardboard boxes used as packing materials. As a result, the polarity directions of anode and cathode lead terminals of the electrolytic capacitors placed in the cardboard boxes are not aligned, causing many problems such as needing to manually check the polarity of the electrolytic capacitors and the like when the electrolytic capacitors are picked from the cardboard boxes for mounting on printed wiring boards.

Figure 10:
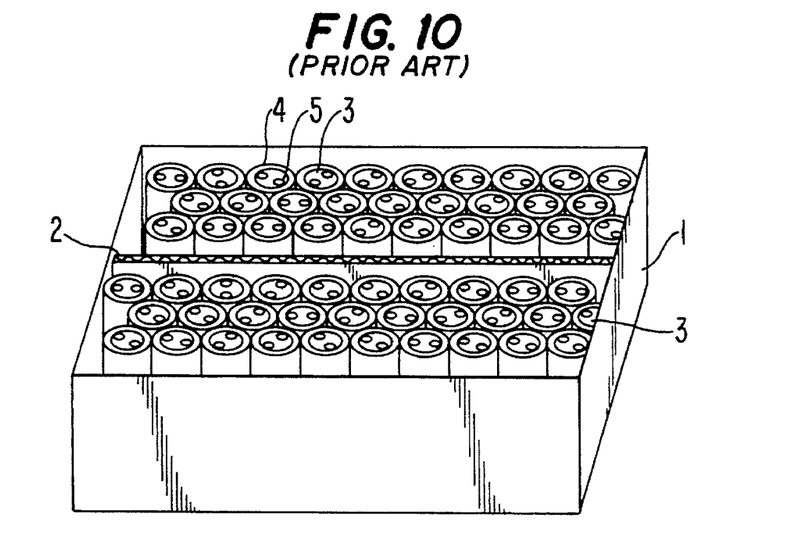
FIG. 10 is a perspective view of a conventional capacitor packing tray and method.

As illustrated in FIG. 10, the conventional packing method of electrolytic capacitors uses a cardboard box 1, wherein a partitioning material 2 is installed and a plurality of electrolytic capacitors 3 are randomly contained. The opening of the cardboard box 1 is covered with a lid (not shown in FIG. 10) and then the lid and the cardboard box is bound together with bands (not shown in FIG. 10) to complete of packing the electrolytic capacitors 3.

However, with the aforementioned conventional packing method of electrolytic capacitors, a plurality of the electrolytic capacitors with the anode lead terminals 4 and cathode lead terminals 5 positioned upward are simply placed in the cardboard box 1.

Therefore, each of the electrolytic capacitors contained rotates freely resulting in random rotational positioning of the anode lead terminals 4 and cathode lead terminals 5 of the electrolytic capacitors 3. This necessitates of confirming the polarity of each of the electrolytic capacitors contained in the cardboard box by picking up each respective capacitor by hand when the electrolytic capacitors are taken out of the cardboard box for mounting on a printed wiring board (not shown in FIG. 10) for an assembly work. This random rotational positioning of the capacitors and the need to confirm polarity alignment of the terminals has been a serious problem in a circuit assembly work.

Furthermore, because the aforementioned electrolytic capacitors 3 are contained in the cardboard box 1 closely in contact with one another, it makes it impossible for an automatic circuit assembly machine to pick each of the electrolytic capacitors 3 for automated mounting of electrolytic capacitors on a circuit board.

None of the conventional prior art packing methods and materials provides the advantages of aligning the polarity junctions of the anode and cathode lead terminals of the capacitor in a manner to restrict rotational movement of the capacitors and allow the capacitor to be picked up in an orderly manner for automatic mounting on printed wiring boards without requiring polarity confirmation. The conventional prior art capacitor packing methods and materials also lack the advantages of facilitating a smooth automatic mounting of a plurality of electrolytic capacitors onto a printed wiring board.

SUMMARY OF THE INVENTION

According to the invention, a container tray comprises a plurality of container hollows for containing a plurality of capacitors. The electrolytic capacitors are held in respective container hollows with the polarity directions of the anode lead terminals and cathode lead terminals aligned in the same direction for all the capacitors. The polarity of the capacitors is maintained that way without any later rotation of the capacitor body by means of lead terminal protection sections furnished in each respective container hollow, once all the capacitors are placed in the container hollows with the polarity directions aligned uniformly in the same direction for all the capacitors.

Preferably, the container hollows are formed in the container tray in a manner to allow an automatic mounting machine to smoothly mount all electrolytic capacitors contained in the container tray automatically on a printed wiring board.

One capacitor packing method comprises the steps of: placing a plurality of capacitors having lead terminals with a certain specific position and direction in a plurality of container hollows of a capacitor container tray, each of said container hollows having terminal protecting sections disposed to maintain polarity of said lead terminals; putting the tray containing capacitors in a receptacle; and covering the receptacle with a cover; and binding the receptacle.

Another capacitor packing method comprises the steps of: placing a plurality of capacitors, each capacitor having an anode lead terminal and a cathode lead terminal, in a capacitor container tray, which is furnished with a plurality of container hollows with capacitor terminal protecting sections disposed to maintain polarity of said lead terminals, one by one at a certain fixed position and in a certain aligned direction of polarity; placing the capacitor container tray in a receptacle with the opening side of the both directed upward, covering the receptacle by a cover lid, and binding the foregoing receptacle covered by the cover lid with bands.

Another capacitor packing method comprises the steps of: placing a plurality of capacitors, each capacitor having an anode lead terminal and a cathode lead terminal, in a capacitor container tray, which is furnished with a plurality of container hollows with capacitor terminal protecting sections disposed to maintain the polarity of said lead terminals, one by one at a certain fixed position and in a certain aligned direction of polarity; placing the capacitor container tray on the opposite side of the cover lid whose position is reversed upside-down from the aforementioned position; placing the receptacle having no cover lid with its opening facing downward and its bottom side directing upward over the capacitor container tray sitting on the aforementioned reversed cover lid; reversing upside down the whole body combining the cover lid, the capacitor contained tray and the cover lid less receptacle so as to have the bottom side of the receptacle positioned at the lower side, and binding the aforementioned whole body of the receptacle containing the capacitors with bands.

As pointed out in greater detail below, this invention provides important advantages of maintaining polarity alignment of lead terminals of capacitors fitted into container hollows of the container tray, and positioning the capacitors for ready use in an automatic mounting machine.

The invention itself, together with further objects and attendant advantages, will best be understood by reference to the following detailed description taken in conjunction with the accompanying drawings.

DETAILED DESCRIPTION OF THE INVENTION

Turning now to the drawings, in FIGS. 1 through FIG. 5, there is shown an electrolytic capacitor (or "capacitor") 11 having an anode lead terminal 12 and a cathode lead terminal 13, both of which look like a bull horn, respectively. The electrolytic capacitor 11 is held in an electrolytic capacitor container tray (or "container tray") 14. The electrolytic capacitor container tray 14 is constructed in a rectangular shape out of low cost polystyrene.

Figure 1:
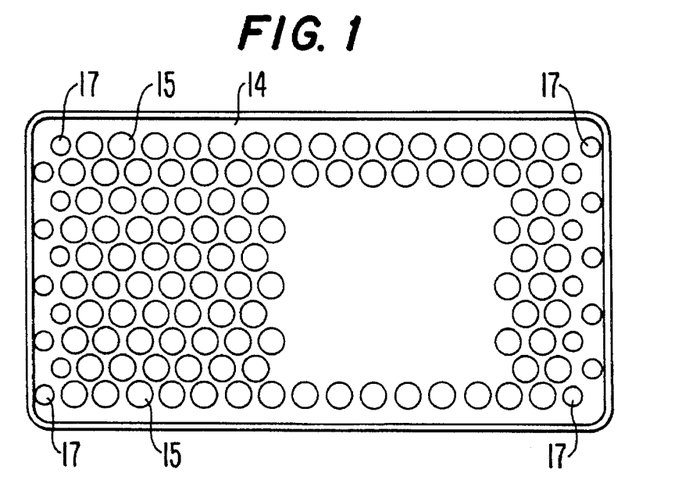
FIG. 1 is a top view of a container tray used in an example of the embodiment of this invention's capacitor packing methods.

The container tray 14 has a plurality of container hollows 15 for placing the electrolytic capacitor 11 in each respective container hollow 15. The container tray 14 is preferably formed by monolithically molding.

In addition, a terminal protection section 16 is formed by extrusion at the time of the foregoing monolithic molding of the container tray 14 in the bottom of each respective container hollow 15 for holding the anode lead terminal 12 and the cathode lead terminal 13 of the electrolytic capacitor 11.

Figure 2:
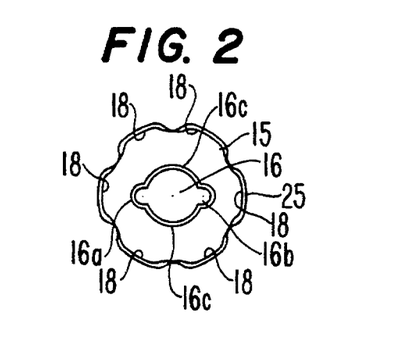
FIG. 2 is a top view showing a container hollow of the container tray of FIG. 1.
Figure 3:
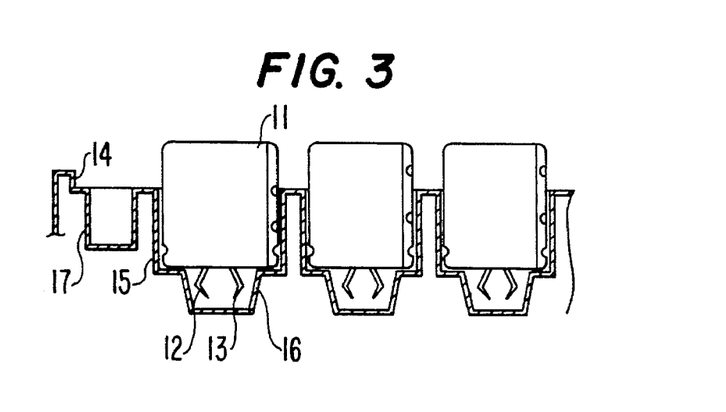
FIG. 3 is a partial sectional view showing how electrolytic capacitors are placed in the container tray of FIG. 1.

As shown in FIG. 2 and FIG. 3, each container hollow 15 is formed almost in a cylindrical shape and each terminal protection section 16 is formed in a cylindrical shape with two terminal rotation preventive sections 16a and 16b extruding to both sides wherein the anode lead terminal 12 and the cathode lead terminal 13 of the electrolytic capacitor 11 are settled respectively and fixed in position. A plurality of shock absorbing hollows 17 is formed along the edges of the electrolytic capacitor container tray 14 by monolithic molding for the purpose of increasing the overall strength of the electrolytic capacitor container tray 14. Also, there are shock absorbing hollows 17 along the periphery of the foregoing electrolytic capacitor container tray 14, made by monolithic molding. These shock absorbing hollows 17 serve to intensify the overall strength of the electrolytic capacitor container tray 14 and to prevent damage from infliction of shock to the electrolytic capacitors 11 due to excellent shock absorbing characteristics even when the package of the electrolytic capacitors 11 is accidentally dropped.

Furthermore, a plurality of the foregoing container hollows 15 are separated from one another by partitioning walls 18 and the surface 25 of each respective partitioning wall 18 is provided with a semicircular arc shaped concavity 19, resulting in an increase of the overall strength of the electrolytic capacitor container tray 14. The improved shock absorbing characteristics of the electrolytic capacitor container tray 14 thus realized make it possible to prevent damage from infliction of shock to the electrolytic capacitors 11 even when the package of the electrolytic capacitors 11 is accidentally dropped.

Figure 4:
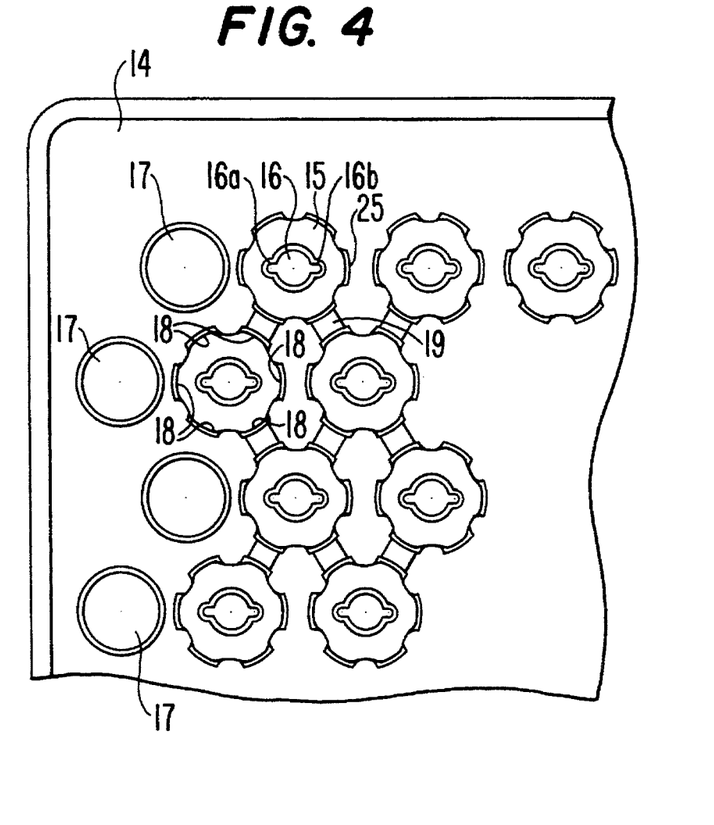
FIG. 4 is a grossly enlarged partial plan view of the container tray of FIG. 1.
Figure 5:
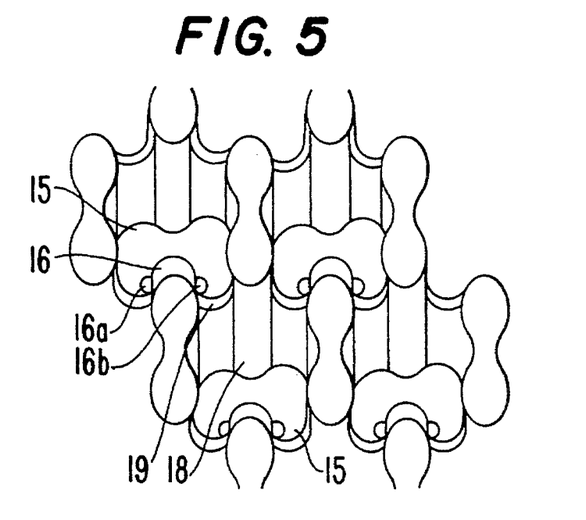
FIG. 5 is a perspective illustration showing the container hollows of the container tray of FIG. 4.

As shown in FIG. 4 and FIG. 5, each of the upper edges of partitioning walls 18 existent between container hollows 15 has a semicircular concavity 19 for the purpose of increasing overall strength of the electrolytic capacitor container tray 14. In addition, as illustrated in FIG. 2 and FIG. 4, each respective surface 25 of six wall sections 18 situated on the inside of the container hollows 15 is concaved in a circular arc form with its degree of concavity decreasing towards the bottom of the container hollow, resulting in more increased strength of the container tray 14. Furthermore, the number of the wall sections 18 cannot necessarily be limited to six, and its surface need not necessarily be concave in a circular arc form.

The spacing between electrolytic capacitors 11 held in each of a plurality of the container hollows 15 is fixed to a distance large enough for an automatic mounting machine of chucking type to pick the electrolytic capacitors 11. Besides, the depth of each of the plurality of the foregoing container hollows 15 is fixed to a suitable certain length so that the end of the electrolytic capacitors 11 opposite to the one with the anode lead terminal 12 and the cathode lead terminal 13 sticks out above the container hollows 15 for enabling the automatic mounting machine of chucking type to chuck the projected portion of the electrolytic capacitors 11 when the electrolytic capacitors 11 are being held in the container hollows 15.

Figure 6:
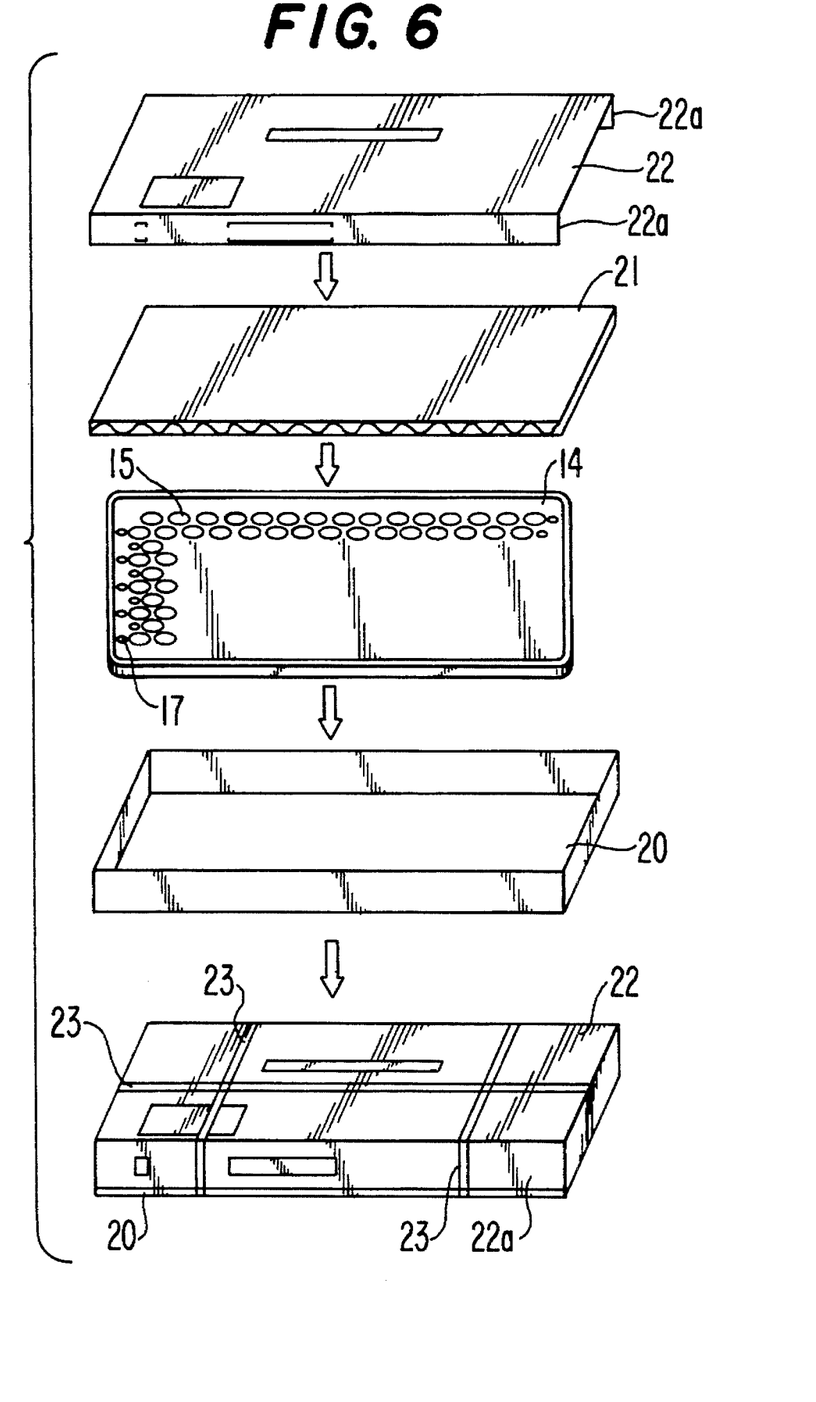
FIG. 6 is a series of dismantled perspective views of packing materials as used for packing an electrolytic capacitor container tray.

Turning now to FIG. 6, a packing method of electrolytic capacitors using the above container tray 14 is described. First, each of a plurality of electrolytic capacitors 11 is placed in each respective container hollow 15 of an electrolytic capacitor container tray 14. At this time, the polarity directions of anode lead terminal 12 and cathode lead terminal 13 are aligned for all of the electrolytic capacitors 11 by, for example, placing the electrolytic capacitors 11 in the container hollows 15 with the anode lead terminals 12 and the cathode lead terminals 13 situated at the left side and at the right side of each container hollow 15, respectively.

Then, the electrolytic capacitor container tray 14 packed with capacitors 11 is placed in a receptacle, such as cardboard box 20, a protector material 21 is put over the capacitor container tray 14, a cover, such as cover lid 22, is placed on top of the protector material 21 with its flaps 22a bent onto the external sides of the cardboard box 20, and then all of these are bound together by bands 23 to complete the packing of the electrolytic capacitors 11.

Figure 7:
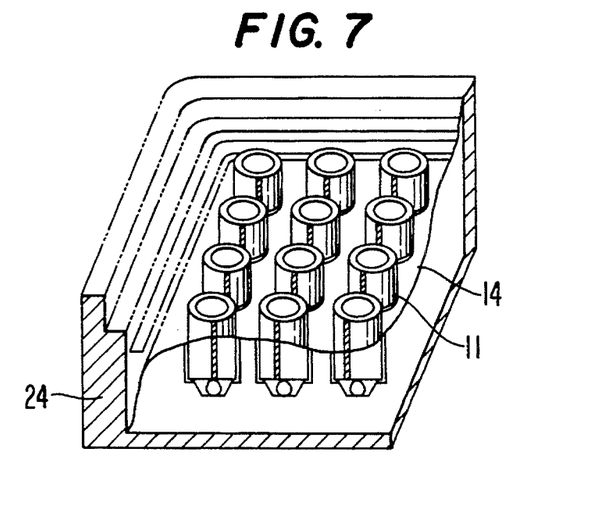
FIG. 7 is a partially broken perspective illustration showing how an electrolytic capacitor container tray is placed in a receptacle such as a cardboard box.

When the electrolytic capacitors 11 packed in this way are mounted automatically on a printed wiring board by use of an automatic mounting machine, the electrolytic capacitor container tray 14 carrying the electrolytic capacitors 11 is taken out by unpacking the foregoing package. Then, as shown in FIG. 7, electrolytic capacitor container tray 14 is removed to a container box 24 made by molding a low foamed styrol which has greater mechanical strength. The electrolytic capacitors 11 held under this condition are picked by chucking by an automatic mounting machine of chucking type for mounting on a printed wiring board.

At this time, the polarity directions of the anode lead terminal 12 and the cathode lead terminal 13 for all the electrolytic capacitors 11 are aligned. Besides, rotational movements of the anode lead terminal 12 and the cathode lead terminal 13 are restricted by terminal protecting sections 16 with a resultant prevention of rotational movements of the electrolytic capacitors 11 after the electrolytic capacitors 11 have been placed and held in the electrolytic capacitor container tray 14. Therefore, the polarity directions of electrolytic capacitors are maintained in one direction and automatic mounting of a plurality of electrolytic capacitors 11 held in an electrolytic capacitor container tray 14 on a printed wiring board by an automatic mounting machine can be performed smoothly.

Figure 8:
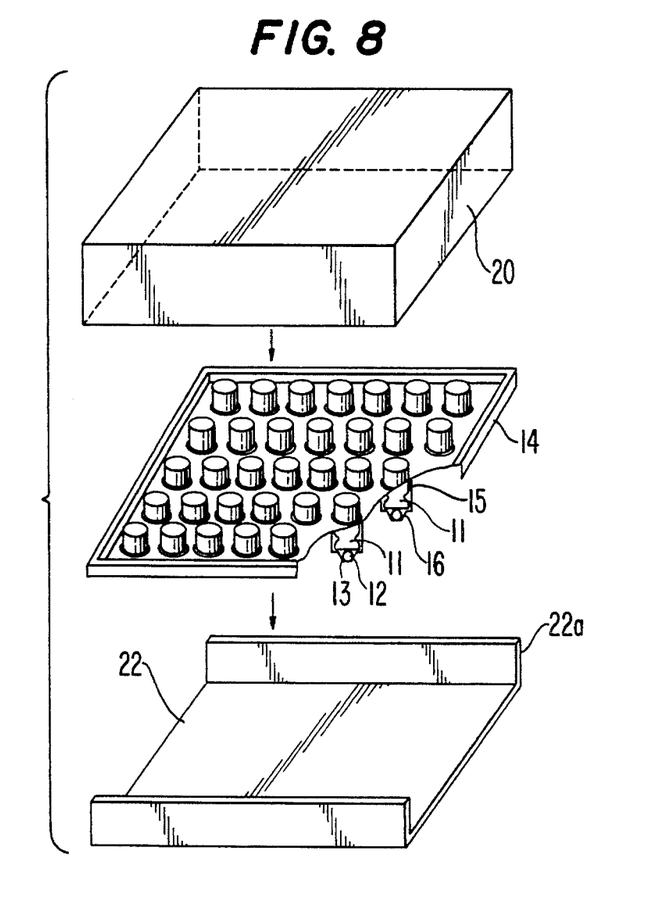
FIG. 8 is a dismantled perspective view showing another example of electrolytic capacitor packing methods.

Variations on the above described embodiments are possible. For example, FIG. 8 shows another electrolytic capacitor packing method. According to this packing method, electrolytic capacitors 11 are first placed in container hollows 15 of an electrolytic capacitor container tray 14 with each respective anode lead terminal 12 and cathode lead terminal 13 of the electrolytic capacitors settled in terminal protecting sections 16. Then, the whole electrolytic capacitor container tray 14 is placed on a cardboard cover lid 22 which is sitting on the floor with its flaps 22a bent upward and a cardboard box 20 is placed over the electrolytic capacitor container tray 14 with its opening faced downward. After this step, the whole package is turned over so that the cardboard lid 22 is situated upside down in FIG. 9 and then bound by bands 23 to complete an electrolytic capacitor packing.

Figure 9:
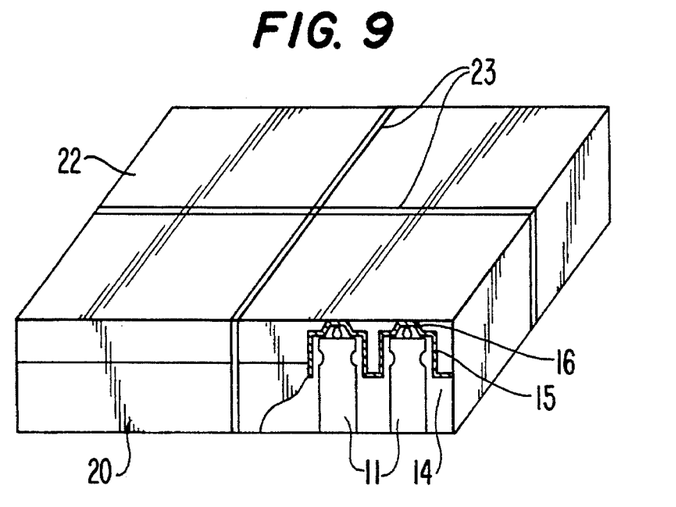
FIG. 9 is a partially broken perspective view of the packing achieved by the capacitor packing method illustrated in FIG. 8.

When a comparison is made between the packing method as illustrated in FIG. 8 and FIG. 9 and the one as illustrated in FIG. 6, the materials used for packing are the same. However, the electrolytic capacitor container tray 14 is situated under the electrolytic capacitors 11 with the packing method of FIG. 6 but the electrolytic capacitor container tray 14 is situated above the electrolytic capacitors 11 with the packing method of FIG. 8 and FIG. 9, wherein the weight of the electrolytic capacitors 11 is not applied directly to the electrolytic capacitor container tray 14. Consequently, even when a mechanical shock or impact is applied to the electrolytic capacitor package from outside during its transportation, the electrolytic capacitor container tray 14 rarely undergoes breakage or deterioration. This feature leads to the possibility of repeated use of the electrolytic capacitor container tray 14 made of resin or paper.

In the foregoing example of one embodiment of a packing method, the whole package was bound by bands 23 at the last step. Instead of this, after the cardboard box 20 is placed over the electrolytic capacitor container tray with its opening faced downward and the whole package is bound by bands 23, the whole banded package can be turned upside down at the final step.

In another foregoing embodiment of this invention, an automatic mounting machine of chucking type is used in mounting electrolytic capacitors 11 automatically on a printed wiring board by chucking the capacitors. In yet a further variation, it is also possible to use an automatic mounting machine of suction pad type for mounting electrolytic capacitors 11 automatically. In this case, the depth of a plurality of the foregoing container hollows 15 can be made as deep as the total length of the electrolytic capacitor 11.

In another foregoing embodiment of this invention, an electrolytic capacitor container tray 14 is made by forming a rectangular container tray with shock absorbing hollows 17 provided along its shorter sides from less costly polystyrene resin. In another variation, paper can be equally well used as the raw material and a square configuration for the tray can be employed. In this case, the shock absorbing hollows 17 might be provided along the periphery of a square shaped tray. Since the strength of polystyrene resin as used in forming the electrolytic capacitor container tray 14 is not strong enough for holding the electrolytic capacitors 11 to be picked up by an automatic mounting machine for mounting the capacitors on a printed wiring board automatically, the whole electrolytic capacitor container tray 14 was removed to and placed in a container box 24 made from stronger low foam styrol in the foregoing example of the embodiments of this invention.

In yet another variation, if the electrolytic capacitor container tray 14 is made from stronger low foam styrol, the container tray does not have to be removed to a separate container box 24 as was in the foregoing example and the electrolytic capacitor container tray itself can be used as the tray for automatic mounting without any problems.

In the above examples, the electrolytic capacitors 11 have the anode lead terminal 12 and the cathode lead terminal 13, both showing a bull horn configuration respectively. In another variation, the shapes of the anode lead terminal 12 and the cathode lead terminal 13 are not limited to the bull horn configuration. This invention is equally applicable to electrolytic capacitors having an anode lead terminal and a cathode lead terminal of different shapes such as a straight lead terminal, for example, and the like.

Although packing methods for electrolytic capacitors having anode lead terminals 12 and cathode lead terminals 13 and packing materials thereof have been dealt with in the foregoing examples, the application of the packing methods and the packing materials thereof is not limited to electrolytic capacitors. It is obviously more convenient for automatic mounting of any leaded capacitors on a printed wiring board to have the capacitors placed in a container orderly and neatly with the terminal positions aligned beforehand.

Of course, it should be understood that a wide range of changes and modifications can be made to the preferred embodiment described above. It is therefore intended that the foregoing detailed description be understood that it is the following claims, including all equivalents, which are intended to define the scope of this invention.

What is claimed is:

1. A capacitor packing method comprising the steps of: placing at least one capacitor, having an anode lead terminal and a cathode lead terminal at one end of the capacitor in a container hollow of a capacitor container tray, said container hollow having a terminal protecting section disposed to maintain polarity of said lead terminals, said terminal protecting section having a length extending from a top surface to a bottom surface and including two recesses extending along the length of the terminal protecting section, said recesses comprised of two terminal holding sub-sections for said anode and cathode lead terminals and two walls connecting between said two terminal holding sub-sections and arcing outwardly in a circular arc to serve as shock absorbing sub-sections; and subsequently advancing the capacitor into said terminal protecting section; placing the tray containing the capacitor in a receptacle; covering the receptacle with a cover; and binding the receptacle.

2. The capacitor packing method of claim 1, wherein said terminal protecting sections are monolithically molded into said container hollows.

3. Capacitor packing materials comprising a container tray including a plurality of container hollows for containing capacitors formed therein, and terminal protecting sections formed under bottoms of said container hollows for holding anode and cathode lead terminals of said capacitors and restricting the rotational movement of said lead terminals, said terminal protecting sections having a length extending from a top surface to a bottom surface and including two recesses extending along the length of the terminal protecting sections.

4. Capacitor packing materials according to claim 4, wherein said container tray includes a plurality of shock absorbing hollows formed along periphery of the container tray by monolithic molding.

5. Capacitor packing materials according to claim 3, wherein said container tray includes edges of partitioning walls existent between the container hollows concaved in a semicircular shape.

6. Capacitor packing materials according to claim 4, wherein said container tray includes edges of partitioning walls existent between the container hollows concaved in a semicircular shape.

7. Capacitor packing materials according to claim 3, claim 4, claim 5 or claim 6, wherein the diameters of the container hollows increase slightly toward a top surface of the container tray at a plurality of places to define a concave sectional curvature of the wall of the container hollow.

8. Capacitor packing materials according to claim 7, wherein a cross-sectional curvature of each respective section of the container hollow wall is concaved at a plurality of places to define a slightly arc shaped curvature.

9. Capacitor packing materials according to claim 8, wherein a degree of concavity of the surface of each respective section of the container hollow wall concaved at a plurality of places decreases toward the bottom of the container hollow.

10. The capacitor packing materials of claim 3, wherein said terminal protecting sections are formed by monolithically molding.

11. Capacitor packing materials comprising: a container tray including a plurality of container hollows formed therein for containing a plurality of capacitors, and terminal protecting sections formed under bottoms of said container hollows for holding anode and cathode lead terminals of said capacitors and restricting the rotational movement of said lead terminals, said terminal protecting sections having a length extending from a top surface to a bottom surface and including two recesses extending along the length of the terminal protecting sections, said recesses comprised of two terminal holding sub-sections for said anode and cathode lead terminals and two walls connecting between said two terminal holding sub-sections and arcing outwardly in a circular arc to serve as shock absorbing sub-sections; a receptacle disposed to receive said container tray with the terminal protecting sections situated at an upper side, said capacitors held in position with the anode and cathode lead terminals of said capacitors facing upward, said receptacle including a cover extending to sides of the terminal protecting sections of said container tray, and bands disposed to bind said receptacle.

12. The capacitor packing materials of claim 11, wherein said terminal protecting sections are formed by monolithically molding.

13. A container tray for aligning the polarity of anode and cathode lead terminals of a plurality of electrical devices comprising a plurality of container hollows disposed to receive said electrical devices, and a plurality of terminal protecting sections formed proximate to each of said container hollows for holding said anode and cathode lead terminals of said electrical devices in a manner to maintain predetermined polarity alignment of said electrical devices within said container tray; said terminal protecting sections having a length extending from a top surface to a bottom surface and including two recesses extending along the length of the terminal protecting sections, said recesses comprised of two terminal holding sub-sections for said anode and cathode lead terminals and two walls connecting between said two terminal holding sub-sections and arcing outwardly in a circular arc to serve as shock absorbing sub-sections.

14. The container tray according to claim 13, wherein each of said terminal protecting sections is monolithically molded with said container hollow.

15. The container tray according to claim 13, wherein a plurality of shock absorbing hollows are formed on said container tray.

16. The container tray according to claim 13, wherein said container hollows are configured and spaced apart at a distance for an automatic mounting machine to pick up said devices from said container hollows for automatic mounting of said devices onto another electrical element.

17. The container tray according to claim 13, wherein said container tray includes edges of partitioning walls existent between the container hollows concaved in a semicircular shape.

18. The container tray according to claim 15, wherein said container tray includes edges of partitioning walls existent between the container hollows concaved in a semicircular shape.

19. The container tray according to claim 13, wherein the diameters of the container hollows increase slightly toward a top surface of the container tray at a plurality of places to define a concave sectional curvature of the wall of the container hollow.

20. The container tray according to claim 19, wherein a cross-sectional curvature of each respective section of the container hollow wall is concaved at a plurality of places to define a slightly arc shaped curvature.

21. The container tray according to claim 20, wherein the degree of concavity of the surface of each respective section of the container hollow wall concaved at a plurality of places decreases toward the bottom of the container hollow.

22. The container tray according to claim 13, wherein said container hollows include a plurality of wall sections.

23. The container tray according to claim 13, additionally including a container box disposed to receive said container tray whereby said container box provides additional strength to said container tray.

24. Electrolytic capacitor packing materials comprising a container tray having a plurality of approximately cylindrical container hollows for containing vertically cylindrical electrolytic capacitors, each of which has both anode and cathode lead terminals appearing only on one end of each said electrolytic capacitor, formed therein, and terminal retaining sections which are formed under bottoms of said container hollows for holding anode and cathode lead terminals of said electrolytic capacitors, said terminal retaining sections comprising means for restricting the rotational movement of said electrolytic capacitors and comprised of two terminal holding sub-sections for said anode and cathode lead terminals and two walls connecting between said two terminal holding sub-sections and arcing outwardly in a circular arc to serve as shock absorbing sub-sections.

25. Electrolytic capacitor packing materials comprising a container tray having a plurality of approximately cylindrical container hollows for containing vertically cylindrical electrolytic capacitors, each of which has both anode and cathode lead terminals appearing only on one end of each said electrolytic capacitor, formed therein, and terminal retaining sections which are formed under bottoms of said container hollows for holding anode and cathode lead terminals of said electrolytic capacitors, said terminal retaining sections comprising means for restricting the rotational movement of said electrolytic capacitors and comprised of two terminal holding sub-sections for said anode and cathode lead terminals and two walls connecting between said two terminal holding sub-sections and arcing outwardly in a circular arc.

* * * * *